United States Patent
Yu et al.

(10) Patent No.: US 7,561,437 B2
(45) Date of Patent: Jul. 14, 2009

(54) ELECTRONIC ELEMENT MODULE AND ELECTRONIC DEVICE USING THE SAME

(75) Inventors: Liang-Ming Yu, Taoyuan County (TW); Chien-Lung Tsou, Taoyuan County (TW); Hsin-Li Lin, Taoyuan County (TW); Yuming Liu, Miaoli County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 251 days.

(21) Appl. No.: 11/160,393

(22) Filed: Jun. 22, 2005

(65) Prior Publication Data

US 2006/0262510 A1 Nov. 23, 2006

(30) Foreign Application Priority Data

May 18, 2005 (TW) .............................. 94116052 A

(51) Int. Cl.
*H05K 7/00* (2006.01)
(52) U.S. Cl. .................... 361/760; 361/782; 361/803; 361/772; 361/299.1; 361/299.3
(58) Field of Classification Search ............... 361/770, 361/771, 772, 773, 774, 760, 782, 811, 812, 361/328, 329, 803, 299.1–299.3; 174/262, 174/263, 264, 265, 266, 267, 268
See application file for complete search history.

(56) References Cited

U.S. PATENT DOCUMENTS 3,275,895 A * 9/1966 Flaherty ...................... 361/774
3,899,719 A * 8/1975 Murphy ....................... 361/773
4,600,971 A * 7/1986 Rose et al. .................. 361/813
4,869,671 A * 9/1989 Pressley et al. ............... 439/55
5,371,404 A * 12/1994 Juskey et al. ................ 257/659
5,400,221 A * 3/1995 Kawaguchi .................. 361/771
5,442,470 A * 8/1995 Hashimoto ................... 349/58
6,058,004 A * 5/2000 Duva et al. ............... 361/301.4
6,310,759 B2 * 10/2001 Ishigaki et al. .............. 361/309
6,700,795 B1 * 3/2004 Jones et al. .................. 361/784
6,723,926 B2 * 4/2004 Gross et al. ................. 174/252
2002/0039290 A1 * 4/2002 Lemmens .................... 362/249

FOREIGN PATENT DOCUMENTS

CN 2325949 6/1999
TW 265901 12/1995

* cited by examiner

*Primary Examiner*—Dean A. Reichard
*Assistant Examiner*—Hoa C Nguyen
(74) *Attorney, Agent, or Firm*—Jianq Chyun IP Office

(57) ABSTRACT

An electronic element module and an electronic device using the same are provided. The electronic element module includes a circuit board and a plurality of electronic elements. In one embodiment, the circuit board has a plurality of leg-holes. Each of the electronic elements includes a body and a plurality of legs that connected to the body. Wherein, the bodies of the electronic elements are glued each other, and the legs of the electronic elements are partially plugged in the leg-holes. In another one embodiment, the circuit board has a plurality of contacts. The electronic element is disposed on the circuit board with a gap therebetween. The electronic element has a plurality of terminals that electrically connect to the contacts of the circuit board correspondingly. Otherwise, the gap is filled with glue.

16 Claims, 4 Drawing Sheets

ELECTRONIC ELEMENT MODULE AND ELECTRONIC DEVICE USING THE SAME

CROSS-REFERENCE TO RELATED APPLICATION

This application claims the priority benefit of Taiwan application serial no. 94116052, filed on May 18, 2005. All disclosure of the Taiwan application is incorporated herein by reference.

BACKGROUND OF THE INVENTION

1. Field of the Invention

The present invention relates to an electronic element module and an electronic device using the same. More particularly, the present invention relates to an electronic element module with better strength and an electronic device using the same.

2. Description of the Related Art

With the advancing by leaps and bounds of electronic technology, various kinds of electronic products have already been applied widely to our working and living, especially the electronic products, such as the most common information and electrical home appliances, etc. at present. In order to let these electronic products produce the special function, the electronic product nearly all has an electronic element module. The electronic element module includes a circuit board and a plurality of electronic elements mounted thereon. Wherein, the electronic elements are electrical connected to each other via the inner circuits of the circuit board.

FIG. 1A is a schematic partial view showing a conventional electronic element module. With reference to FIG. 1A, the conventional electronic element module 100 essentially comprises a circuit board 110 and a plurality of electronic elements 120 mounted thereon. Wherein, some of the electronic elements 120 such as capacitor essentially comprise a body 122 and two legs 124 connected thereto, and the ends of the legs 124 are connected to the circuit board 110.

However, the electronic element module 100 sustains vibration and shock for a long time during the transportation, and the vibration and shock applied on the electronic element module 100 will be larger with weighty body 122 of the electronic elements 120, especially. Moreover, because of each of the electronic elements 120 is connected to the circuit board 110 by two legs 124 only, the legs 124 with poor strength will fatigue easily owing to the vibration in the direction X shown in FIG. 1A. Consequently, the legs 124 will be cut off, and the electronic elements 120 will be come off. With the result, the electronic element module 100 fails to work. Furthermore, the whole electronic device such as plasma display with the electronic element module 100 built-in will be broken.

To solve the issue described above, a silica gel (not shown) is put between the electronic elements 120 and the circuit board 110 in conventional to enhance the bonding strength among the electronic elements 120 and the circuit board 110. However, this solution can't be used while the electronic elements 120 are arranged with high density.

Moreover, another type of electronic elements that called as "Surface Mounted Device, SMD" is popularly applied in various electronic products. FIG. 1B is a cross section view showing a conventional surface mounted electronic element. With reference to FIG. 1B, the conventional surface mounted electronic element 160 has two terminals 162 that electrically connect to two contacts 172 on a circuit board 170 correspondingly with the solder 180. However, after the surface mounted electronic element 160 has been mounted on the circuit board 170, a gap G10 exists between the surface mounted electronic element 160 and the circuit board 170. Consequently, the gap G10 will make the noises during the operating of the surface mounted electronic element 160 be resonated and amplified, and the user will be discomfort.

SUMMARY OF THE INVENTION

Accordingly, the present invention is directed to provide an electronic element module with less noise and higher bonding strength among the electronic elements and the circuit board thereof.

The present invention is also directed to provide an electronic device with better reliability.

According to an embodiment of the present invention, an electronic element module is provided. The electronic element module essentially comprises a circuit board and a plurality of electronic elements. The circuit board has a plurality of leg-holes, and each of the electronic elements includes a body and a plurality of legs that connected to the body. Wherein, the bodies of the electronic elements are glued each other, and the legs of the electronic elements are partially plugged in the leg-holes.

In an aspect of the invention for the foregoing electronic element module, the electronic elements may include a first element and a second element. The leg-holes corresponding to the first element are arranged in a line that locates in a first direction; the leg-holes corresponding to the second element are arranged in a line that locates in a second direction; and the first direction can be perpendicular to the second direction.

In other aspect of the invention for the foregoing electronic element module, the electronic elements may include a first element, a second element and a third element. The leg-holes corresponding to the first element are arranged in a line that locates in a first direction; the leg-holes corresponding to the second element are arranged in a line that locates in a second direction; the leg-holes corresponding to the third element are arranged in a line that locates in a third direction; and the first direction, the second direction and the third direction construct a triangle or intersect in one point. Wherein, the triangle is a regular triangle, for example.

In another aspect of the invention for the foregoing electronic element module, the electronic elements may include a first element, a second element, a third element and a fourth element. The leg-holes corresponding to the first element are arranged in a line that locates in a first direction; the leg-holes corresponding to the second element are arranged in a line that locates in a second direction; the leg-holes corresponding to the third element are arranged in a line that locates in a third direction; the leg-holes corresponding to the fourth element are arranged in a line that locates in a fourth direction; and the first direction, the second direction, the third direction and the fourth direction construct a quadrangle or intersect in one point. Wherein, the quadrangle is square, for example.

According to another embodiment of the present invention, an electronic element module is provided. The electronic element module essentially comprises a circuit board and at least a electronic element. The circuit board has a plurality of contacts. The electronic element is disposed on the circuit board with a gap therebetween. The electronic element has a plurality of terminals that electrically connect to the contacts correspondingly, and the gap is filled with a glue.

In an aspect of the invention for the foregoing electronic element module, the electronic element may include a capacitor. Moreover, the glue may include epoxy resin.

According to another embodiment of the present invention, an electronic device with the forgoing electronic element module that said two kinds of the electronic elements are used therein is provided. In an aspect of the invention, the foregoing electronic device may include a display panel, and the display panel is electrical connected to electronic element module. Wherein, the display panel may be a plasma display panel (PDP), a liquid crystal display panel (LCD panel) or an organic electro-luminescence display panel (OELD panel).

Accordingly, the electronic element module and the electronic device using the same of this invention have better endurance in shock and vibration, such that the reliability of the electronic element module and the electronic device can be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
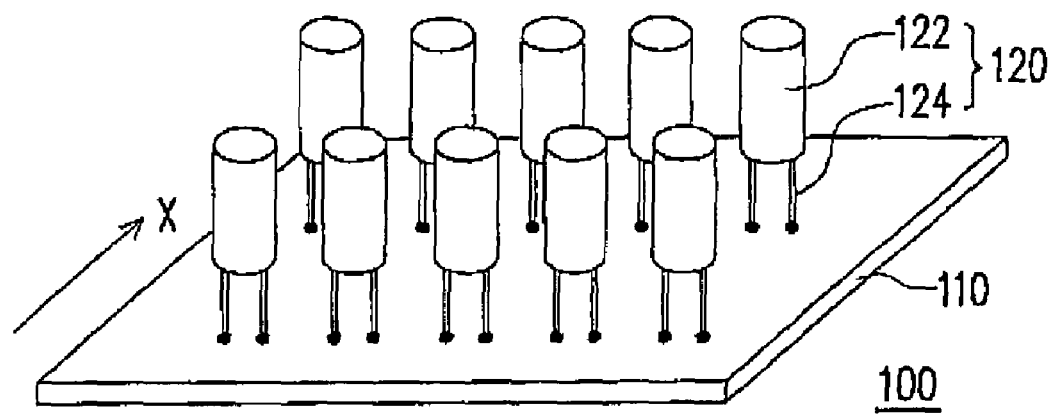
FIG. 1A is a schematic partial view showing a conventional electronic element module.
Figure 1B:
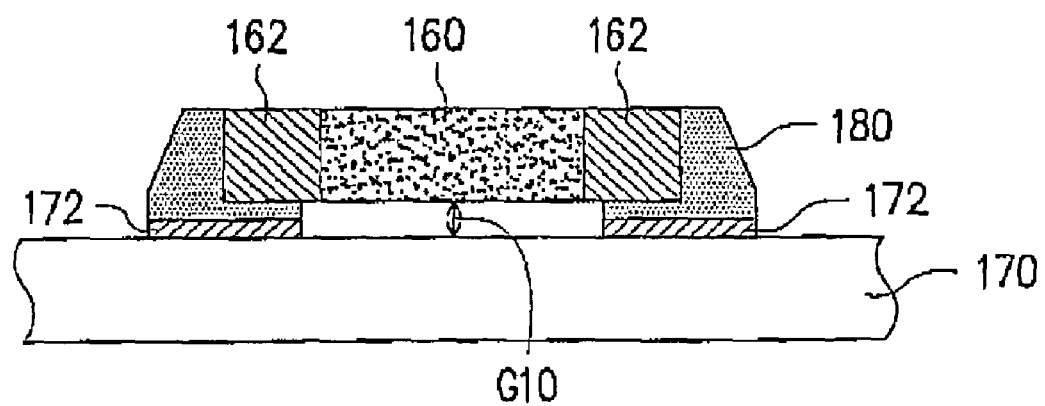
FIG. 1B is a cross section view showing a conventional surface mounted electronic element.

Reference will now be made in detail to the present preferred embodiments of the invention, examples of which are illustrated in the accompanying drawings. Wherever possible, the same reference numbers are used in the drawings and the description to refer to the same or like parts.

Figure 2:
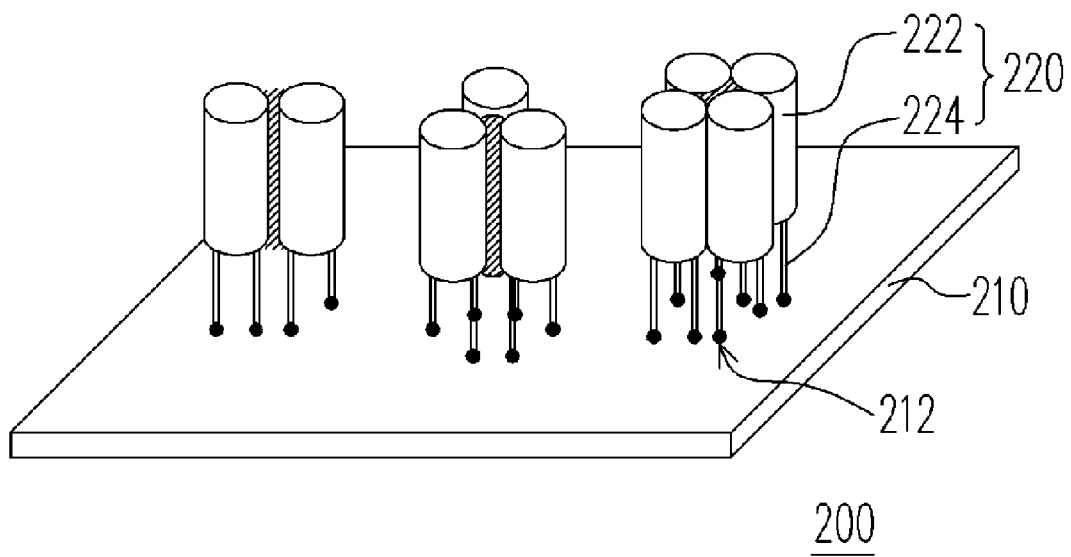
FIG. 2 is a schematic partial view showing an electronic element module according to an embodiment of the present invention.

FIG. 2 is a schematic partial view showing an electronic element module according to an embodiment of the present invention. With reference to FIG. 2, the electronic element module 200 in this embodiment essentially comprises a circuit board 210 and a plurality of electronic elements 220. The circuit board 210 has a plurality of leg-holes 212. Each of the electronic elements 220 includes a body 222 and a plurality of legs 224 that connected to the body 222. In this embodiment, the number of the legs 224 in each of the electronic elements 220 is two, for example. But the number of the legs 224 in each of the electronic elements 220 could be three or more. Moreover, the bodies 222 of several of the electronic elements 220 are glued to each other. The bodies 222 may glue by setting silica gel therebetween. Of course, the bodies 222 may glue by setting other gel, twin adhesive or other appropriate method. The legs 224 of the electronic elements 220 are partially plugged in the leg-holes 212 by welding or other methods. Therefor, the legs 224 of the electronic elements 220 could be fixed in the leg-holes 212, and the electronic elements 220 can be electrical connected to other elements via the inner circuits of the circuit board 210.

The feature of the electronic element module in the present invention is that: in a group of the electronic elements 220 that the bodies 222 thereof are glued to each other, the leg-holes 212 corresponding to the different electronic elements 220 are arranged in different rows. In other words, the leg-holes 212 corresponding to the group of electronic elements 220 that the bodies 222 thereof are glued to each other will not be arranged in one line. With the legs 224 distributed in various directions, the group of electronic elements 220 that the bodies 222 thereof are glued to each other will have better endurance in shock and vibration from any directions. Therefor, the break of the legs 224 caused by fatigue and the coming off of the electronic elements 220 can be avoided.

Moreover, the circuit board 210 in this embodiment can be a printed circuit board (PCB) or others. Certainly, in the electronic element module 200, elements such as driving chip, memory chip, interface slot or others may be assembled on the circuit board 210 as need. In the FIG. 2, we focus on the electronic elements 220 with legs 224, and the other parts are omitted in there.

In the electronic element module 200 of this embodiment, the arrangements of the legs 224 of the electronic elements 220 depend on the amount of the group of electronic elements 220 that glued together. The arrangements of the legs 224 of the electronic elements 220 will be introduced with two, three or four electronic elements 220 in one group. Moreover, if the electronic element module 200 has more electronic elements 220, the electronic elements 220 can be grouped into several groups, or the leg-holes 212 corresponding to different electronic elements 220 can be all arranged in different rows. Certainly, the arrangement of the locations of the leg-holes 212 prefers to be implemented during the fabrication of the circuit board 210.

Figure 3:
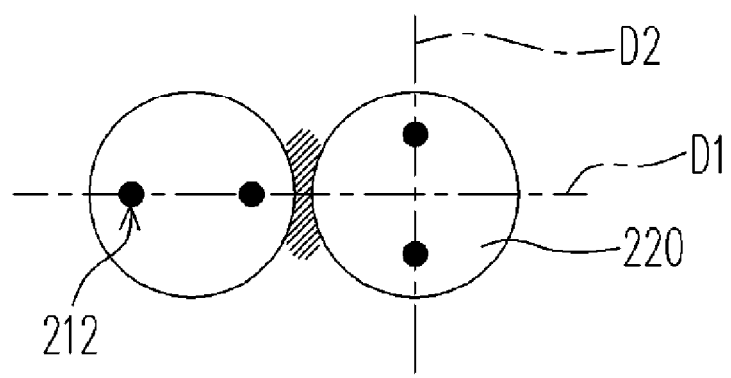
FIGS. 3~5 are schematic top views showing the electronic element module according to the present invention with two, three and four glued electronic elements, respectively.
Figure 4:
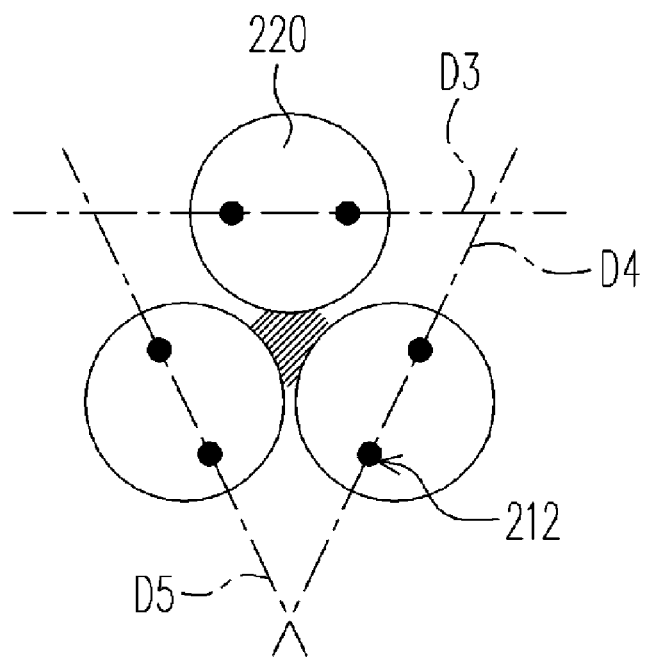
Figure 5:
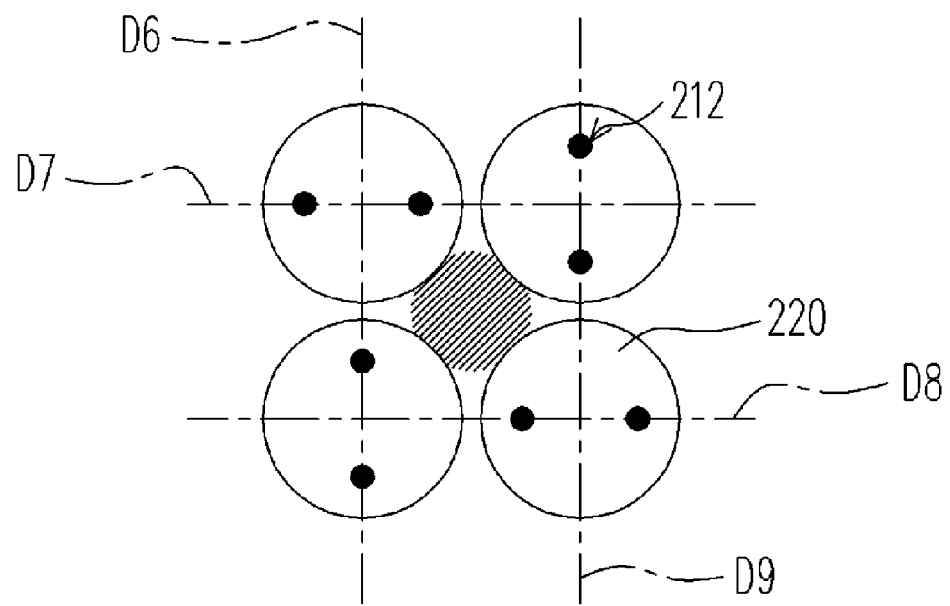

FIGS. 3~5 are schematic top views showing the electronic element module according to the present invention with two, three and four glued electronic elements, respectively.

With reference to FIG. 3, when two electronic elements 220 are glued together, the leg-holes 212 corresponding to one of the electronic elements 220 may arranged in a line that locates in a direction D1, and the leg-holes 212 corresponding to the other electronic element 220 may arranged in a line that locates in a direction D2. Wherein, the direction D1 prefers to be perpendicular to the second direction D2. Naturally, the direction D1 does not restrict to be perpendicular to the second direction D2, but the direction D1 should not coincide to the second direction D2. With the forging design, the bonding strength among the electronic elements 220 and the circuit board 210 could be enhanced.

With reference to FIG. 4, when three electronic elements 220 are glued together, the leg-holes 212 corresponding to this three electronic elements 220 may arranged in three lines that locates in directions D3, D4 and D5, respectively. Wherein, the directions D3, D4 and D5 may construct a triangle therebetween. Meanwhile, the triangle is better to be a regular triangle. Naturally, the directions D3, D4 and D5 could intersect in one point to form an actinoid-shap (not shown in FIG. 4), for example.

With reference to FIG. 5, when four electronic elements 220 are glued together, the leg-holes 212 corresponding to this four electronic elements 220 may arranged in four lines that locates in directions D6, D7, D8 and D9, respectively. Wherein, the directions D6, D7, D8 and D9 may construct a quadrangle therebetween. Meanwhile, the quadrangle is better to be a square. Naturally, the directions D6, D7, D8 and D9 could intersect in one point to form an actinoid-shap (not shown in FIG. 5), for example.

Figure 6:
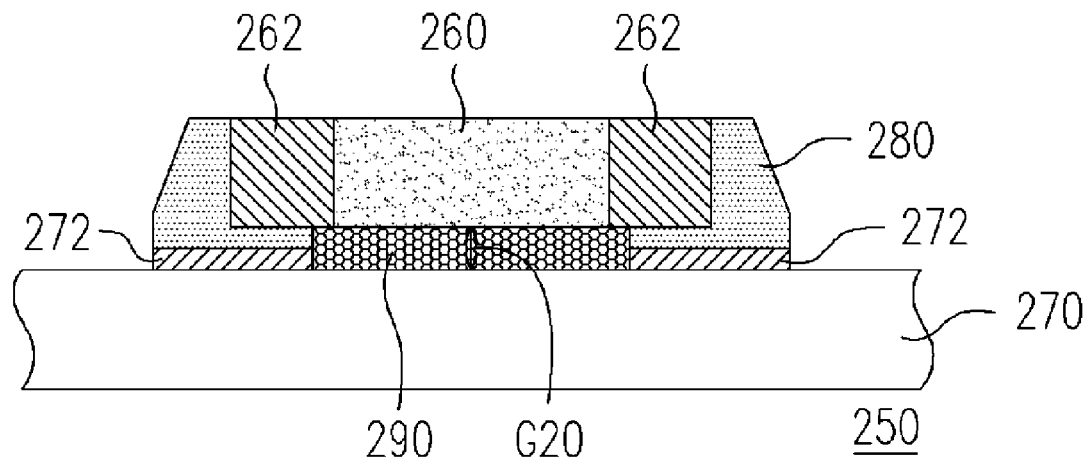
FIG. 6 is a cross section view showing an electronic element module according to another embodiment of the present invention.

FIG. 6 is a cross section view showing an electronic element module according to another embodiment of the present invention. With reference to FIG. 6, the electronic element module 250 essentially comprises a circuit board 270 and at least a electronic element 260. The circuit board 270 has a plurality of contacts 272 thereon. The electronic element 260 is disposed on the circuit board 270 with a gap G20 therebetween. Meanwhile, the electronic element 260 has a plurality of terminals 262 that electrically connect to the contacts 272 of the circuit board 270 correspondingly with a solder 280, for example. In other words, the electronic element 260 in this embodiment can be the surface mounted electronic element. In general, the electronic element 260 could be the resistance, capacitor, inductor, jumper . . . etc. Furthermore, the gap G20 between the electronic element 260 and the circuit board 270 is filled with a glue 290. The glue 290 could be the epoxy resin or others. As described in above, since the gap G20 is filled with the glue 290, the noises accompanied with the vibration of the electronic element 260 and the circuit board 270 will be decreased, and the noises will not be resonated and amplified by the gap.

Figure 7:
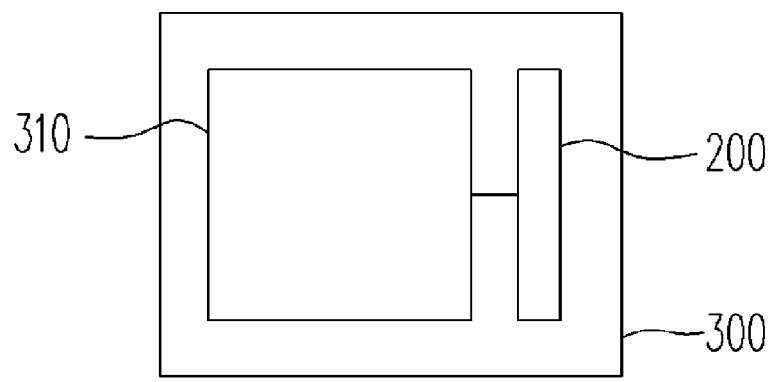
FIG. 7 is a block diagram showing an electronic device according to an embodiment of the present invention.

FIG. 7 is a block diagram showing an electronic device according to an embodiment of the present invention. With reference to FIG. 7, the electronic device 300 of this embodiment could be a display, air conditioner, refrigerator or other electronic devices, and the electronic element module 200, the electronic element module 250 mentioned in above embodiments or combination thereof is one of the components of the electronic device 300. Herein, the description of the electronic element module 200 and 250 is omitted. If the electronic device 300 is a display, it may further includes a display panel 310 that electrical connected to the electronic element module 200 and/or the electronic element module 250, and the electronic element module 200 and/or the electronic element module 250 could be used to control the display panel 310. Wherein, the display panel 310 can be a plasma display panel, a liquid crystal display panel or an organic electro-luminescence display panel. Moreover, while the display panel 310 is liquid crystal display panel, the electronic device 300 may further includes a back light module (not shown) for providing the surface light source to the liquid crystal display panel. Because the electronic element module 200 and/or the electronic element module 250 built-in the electronic device 300 has better endurance in shock and vibration, the electronic device 300 could be keep away from the damage in the process of transportation. Consequently, the reliability of the electronic device 300 could be improved after received by the customers.

Accordingly, because of the leg-holes corresponding to the different electronic elements are arranged in different rows in the electronic element module and the electronic device using the same of this invention, and the adjacent electronic elements are glued together, the legs in different rows could resist more shock and vibration. Else, since the gap between the electronic element 260 and the circuit board 270 is filled with glue, the generation of the noises and the amplification of the noises can be restrain. Consequently, the reliability of the electronic element module and the electronic device could be raised.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic element module, comprising:
a circuit board, has a plurality of leg-holes; and
a plurality of electronic elements, each of the electronic elements includes a body and a plurality of legs that connect to the body, wherein the bodies of the electronic elements are glued to each other, and the legs of the electronic elements are partially plugged in the leg-holes,
wherein the electronic elements includes:
a first element, wherein all the leg-holes corresponding to the first element are arranged in single line that locates in a first direction; and
a second element, wherein all the leg-holes corresponding to the second element are arranged in single line that locates in a second direction, and the first direction is perpendicular to the second direction.

2. An electronic element module, comprising:
a circuit board, has a plurality of leg-holes; and
a plurality of electronic elements, each of the electronic elements includes a body and a plurality of legs that connect to the body, wherein the bodies of the electronic elements are glued to each other, and the legs of the electronic elements are partially plugged in the leg-holes,
wherein the electronic elements includes:
a first element, wherein the leg-holes corresponding to the first element are arranged in a line that locates in a first direction;
a second element, wherein the leg-holes corresponding to the second element are arranged in a line that locates in a second direction; and
a third element, wherein the leg-holes corresponding to the third element are arranged in a line that locates in a third direction, and the first direction, the second direction and the third direction construct a triangle or intersect in one point.

3. The electronic element module according to claim 2, wherein the triangle includes regular triangle.

4. An electronic element module, comprising:
a circuit board, has a plurality of leg-holes; and
a plurality of electronic elements, each of the electronic elements includes a body and a plurality of legs that connect to the body, wherein the bodies of the electronic elements are glued to each other, and the legs of the electronic elements are partially plugged in the leg-holes,
wherein the electronic elements includes:
a first element, wherein the leg-holes corresponding to the first element are arranged in a line that locates in a first direction;
a second element, wherein the leg-holes corresponding to the second element are arranged in a line that locates in a second direction;
a third element, wherein the leg-holes corresponding to the third element are arranged in a line that locates in a third direction; and
a fourth element, wherein the leg-holes corresponding to the fourth element are arranged in a line that locates in a fourth direction, and the first direction, the second direction, the third direction and the fourth direction construct a quadrangle or intersect in one point.

5. The electronic element module according to claim 4, wherein the quadrangle includes square.

6. An electronic device characterized in that the electronic device includes an electronic element module, wherein the electronic element module comprising:

a circuit board, having a plurality of leg-holes; and
a plurality of electronic elements, each of the electronic elements includes a body and a plurality of legs that connect to the body, wherein the bodies of the electronic elements are glued to each other, and the legs of the electronic elements are partially plugged in the leg-holes,
wherein the electronic elements includes:
a first element, wherein all the leg-holes corresponding to the first element are arranged in single line that locates in a first direction; and
a second element, wherein all the leg-holes corresponding to the second element are arranged in single line that locates in a second direction, and the first direction is perpendicular to the second direction.

7. The electronic device according to claim 3, further comprising a display panel which is electrically connected to the electronic element module.

8. The electronic device according to claim 7, wherein the display panel includes plasma display panel, liquid crystal panel or organic electro-luminescence display panel.

9. An electronic device characterized in that the electronic device includes an electronic element module, wherein the electronic element module comprising:
a circuit board, having a plurality of leg-holes; and
a plurality of electronic elements, each of the electronic elements includes a body and a plurality of legs that connect to the body, wherein the bodies of the electronic elements are glued to each other, and the legs of the electronic elements are partially plugged in the leg-holes,
wherein the electronic elements includes:
a first element, wherein the leg-holes corresponding to the first element are arranged in a line that locates in a first direction;
a second element, wherein the leg-holes corresponding to the second element are arranged in a line that locates in a second direction;
a third element, wherein the leg-holes corresponding to the third element are arranged in a line that locates in a third direction; and the first direction, the second direction and the third direction a triangle or intersect in one point.

10. The electronic device according to claim 9, wherein the triangle includes regular triangle.

11. The electronic device according to claim 9, further comprising a display panel which is electrically connected to the electronic element module.

12. The electronic device according to claim 11, wherein the display panel includes plasma display panel, liquid crystal display panel or organic electro-luminescence display panel.

13. An electronic device characterized in that the electronic device includes an electronic module, wherein the electronic element module comprising:
a circuit board, having a plurality of leg-holes; and
a plurality of electronic elements, each of the electronic elements includes a body and a plurality of legs that connect to the body, wherein the bodies of the electronic elements are glued to each other, and the legs of the electronic elements are partially plugged in the leg-holes,
wherein the electronic elements includes;
a first element, wherein the leg-holes corresponding to the first element are arranged in a line that locates in a first direction;
a second element, wherein the leg-holes corresponding to the second element are arranged in a line that locates in a second direction;
a third element, wherein the leg-holes corresponding to the third element are arranged in a line that locates in a third direction; and
a fourth element, wherein the leg-holes corresponding to the fourth element are arranged in a line that locates in a fourth direction, and the first direction, the second direction, the third direction and the fourth direction construct a quadrangle or intersect in one point.

14. The electronic device according to claim 13, wherein the quadrangle includes square.

15. The electronic device according to claim 13, further comprising a display panel which is electrically connected to the electronic element module.

16. The electronic device according to claim 15, wherein the display panel includes plasma display panel, liquid crystal display panel or organic electro-luminescence display panel.

* * * * *